(12) United States Patent
Bangert et al.

(10) Patent No.: US 8,137,510 B2
(45) Date of Patent: Mar. 20, 2012

(54) COATER WITH A LARGE-AREA ASSEMBLY OF ROTATABLE MAGNETRONS

(75) Inventors: Stefan Bangert, Steinau (DE); Frank Fuchs, Geiselbach-Ommersbach (DE); Ralph Lindenberg, Büdingen (DE); Andreas Lopp, Freigericht-Somborn (DE); Uwe Schüssler, Aschaffenburg (DE); Tobias Stolley, Frankfurt am Main (DE)

(73) Assignee: Applied Materials GmbH & Co. KG, Alzenau (DE)

( * ) Notice: Subject to any disclaimer, the term of this patent is extended or adjusted under 35 U.S.C. 154(b) by 995 days.

(21) Appl. No.: 11/121,563

(22) Filed: May 4, 2005

(65) Prior Publication Data
US 2005/0252768 A1 Nov. 17, 2005

(30) Foreign Application Priority Data
May 5, 2004 (EP) .................................... 04010696

(51) Int. Cl.
*C23C 14/00* (2006.01)
(52) U.S. Cl. ......... 204/192.12; 204/298.21; 204/298.22; 204/298.26
(58) Field of Classification Search ............. 204/298.18, 204/298.21, 298.26, 298.22, 192.12
See application file for complete search history.

(56) References Cited

U.S. PATENT DOCUMENTS

| 4,417,968 | A | * | 11/1983 | McKelvey | 204/192.12 |
|---|---|---|---|---|---|
| 5,215,638 | A | * | 6/1993 | Hausler | 204/192.12 |
| 5,338,422 | A | * | 8/1994 | Belkind et al. | 204/192.12 |
| 5,563,734 | A | * | 10/1996 | Wolfe et al. | 359/360 |
| 5,567,289 | A | * | 10/1996 | Taylor et al. | 204/298.11 |
| 5,626,727 | A | * | 5/1997 | Yamanishi et al. | 204/192.12 |
| 5,814,195 | A | * | 9/1998 | Lehan et al. | 204/192.12 |
| 6,365,010 | B1 | * | 4/2002 | Hollars | 204/192.12 |

FOREIGN PATENT DOCUMENTS

| JP | 2003096561 A | * | 4/2003 |
|---|---|---|---|
| JP | 2003183823 A | * | 7/2003 |
| WO | WO 99/54911 | * | 4/1999 |

OTHER PUBLICATIONS

Machine Translation of JP 2003-183823 published to Nishiki on Jul. 3, 2003.*
Machine Translation to Nishiki (JP 2003-096561) published Apr. 2003.*

* cited by examiner

*Primary Examiner* — Keith Hendricks
*Assistant Examiner* — John Brayton
(74) *Attorney, Agent, or Firm* — Patterson & Sheridan, L.L.P.

(57) ABSTRACT

This invention relates to a coater for the coating, in particular, of large-area substrates by means of cathode sputtering, the coater having a coating chamber and, provided therein, a cathode assembly (2) where the material to be sputtered is located on a target (4) with a curved surface, the material to be sputtered being located, in particular, on the lateral surface of a cylinder, there being in a single coating chamber for a coherent coating zone at least three, preferably more, cathode assemblies (2) with rotatable, curved targets (4) positioned one beside the other.

15 Claims, 2 Drawing Sheets

COATER WITH A LARGE-AREA ASSEMBLY OF ROTATABLE MAGNETRONS

This invention relates to a coater according to the preamble of claim 1.

Coaters with which the coating is applied to a substrate by means of cathode sputtering have been known for a long time and are used for a wide variety of coating purposes. The design and engineering of such coaters vary greatly in accordance with the particular requirements the coating must fulfil. There are, for example, many different kinds of cathodes, such as planar cathodes, magnetron cathodes, rotatable magnetrons, etc. Whereas with planar cathodes, the coating material to be sputtered is configured in the shape of a flat, planar target, the target surfaces of so-called rotatable cathodes are curved, being configured, in particular, in the form of a cylinder-like tube. Due to the continuous rotation of a cylinder-like tube during the coating process, the target material is sputtered evenly, thus preventing locally concentrated sputtering and resultant formation of grooves, which in turn might impair the coating quality.

Through use of so-called magnetron cathodes, or magnetrons, with which magnet assemblies behind the sputter target facilitate plasma formation in front of the target, at the same time stabilizing the plasma and evening it out, it is likewise possible to achieve improved deposition. The use of so-called rotatable magnetrons, in particular, is also known, in which case magnets or magnet assemblies are provided concentrically within the cylinder-tube-like target. Rotatable magnetrons of this kind are used, for example, in continuous-duty in-line coaters for the coating of architectural glass. The state-of-the-art practice is normally to locate two such magnetrons side by side in a coating chamber. The disadvantage of this arrangement is that only a small coating zone is available in which an even coating with an almost constant coating thickness can be obtained. This makes it necessary to move the substrates if large surfaces, i.e. large-area substrates, are to be coated.

The object of this invention is therefore to provide a coater and, specifically, a cathode assembly, with which a large-area substrate may be coated evenly and with which, additionally and in particular, material losses in the form of overspray during the coating process should be kept low. In addition, the coater should be easy to set up and operate.

This object is established by means of a coater having the features of claim 1. Useful embodiments form the subject matter of the dependent claims.

This invention for the first time solves the problem of being able to provide a large coating zone with an even coating of uniform thickness without having to put up with a large loss of coating material. In other words, the invention makes it possible to coat large-area substrates statically, that is, without moving the substrate. Surprisingly, it was found that if cathode assemblies having rotatable, curved targets—especially targets in the form of cylinder tubes—are used, a plurality of cathodes, in particular at least three but preferably four, five, six or more cathodes, may be positioned beside each other, thus creating a large coating zone with which, by way of specific sputtering at a curved target surface, an even coating can be applied, in particular to obtain an even and uniform coating thickness, without having to put up with excessive loss of coating material. This advantage is due in large part to the curved target surface; according to preferred embodiments, the evenness of the large-area coating deposited can be improved still further, while keeping material losses low, by configuring the cathodes themselves, and assembling the many cathodes relative to each other, in such manner that the positive effect is underscored or enhanced further.

With respect to the cathode configuration, it has proved advantageous here to use magnetron cathodes that exhibit magnetic field arrays behind the target—in the case of cylindrical targets, within the core of the cylinder tube—in order to form a plasma in front of the target surface and to stabilize this plasma.

The magnet assembly is preferably rotatable or slewable about the longitudinal axis of the cathode, i.e. in the case of a cylinder-tube-like target, about the cylinder's longitudinal axis, such that the magnets or the magnet assembly can be adjusted or set to face the substrate. By rotating or slewing the magnets or magnet assembly in this way, the sputter zone on the target surface can be altered in its orientation toward the substrate; with the correct setting, this arrangement permits even coating deposition, i.e. a coating of even thickness, on the substrate.

In particular, according to a preferred embodiment, the coater may be configured such that during the coating process, the magnets or magnet assembly oscillate(s) continuously about a given position i.e., move(s) to and fro, which likewise results in the deposition of an even coating.

In addition, the magnets or magnet assemblies may be slewable or displaceable also within the magnet assembly, thus making it possible to vary the magnetic field area and, in turn, to positively influence deposition of the coating. In the case of a cylinder-tube-like target, the magnet assembly may, for example, be positioned in a cylinder-tube segment along the cathode's longitudinal axis in a 25° segment oriented towards the substrate. To increase the magnetic field area, the segment could be enlarged, for example by displacing or slewing the outer magnets outwards about the cathode's longitudinal axis, so that the magnets are assembled in a segment of, for example, 35°.

In cases of oscillation or vibration (wobbling) of the magnets or magnet assembly about a position, the speed with which the magnets or magnet assembly is/are moved may additionally be defined or set in different ways, so that, for example during the to-and-fro movement of the magnets or magnet assembly about a zero position, the absolute speed differs according to the position. For example, a low speed might be selected at the reversal points, and a high speed therebetween.

According to a useful embodiment, it is advantageous with cylinder-tube-like targets or cathodes to provide an additional magnet assembly or magnets on the side of the cathode facing away from the coating zone, in the vicinity of the target's end face, so that a plasma can form in this area in front of the target surface. This measure prevents re-deposition on the target.

Besides providing the cathode assembly having rotatable, curved targets with suitable magnets and magnet assemblies to positively influence the deposition process, the even deposition of a coating of uniform thickness on a large-area coating zone may be additionally improved and underscored by positioning the cathode assemblies that are provided side by side in a coating chamber to ensure a single, coherent, large-area coating zone at different distances from the coating zone, i.e. from the substrate, and in particular by positioning them on a surface that curves around the coating zone.

In this context, it has proved a good idea to configure this curved surface as a cylinder surface, so that, viewed in cross-section, the cathodes are essentially arranged on a circular path, preferably equidistant from one another and with their longitudinal axes parallel to each other.

In another useful embodiment, the cathode assemblies may be positioned in such a way that the two cathodes at the edges of the sequence of cathodes are displaced inwards, further towards the substrate, and/or are pushed along nearer to the adjacent cathodes. This has a positive influence on the even deposition of a coating, especially in the edge areas of the coating zone.

The radius of the circular path, that is, of the lateral surface of the cylinder, upon which the cathodes are positioned, is preferably selected to be very large in comparison with the distance between the cathodes and the substrate, or coating zone, so that the surface along which the cathodes are positioned is only slightly curved.

With the cathodes positioned on a circular path or a lateral surface of a cylinder, it is particularly advantageous if the magnets or magnet assemblies of the magnetron cathodes are oriented radially towards the coating zone; in other words, if the mid-perpendiculars through the magnet sets of preferably all the cathodes point towards the centre of the circle or of the cylinder along which the cathodes are positioned. Here too, however, slewing or vibration of the magnets or magnet assemblies about this position is conceivable.

Although this coater or cathode assembly or cathode configuration permits, in particular, static coating of a large-area zone, i.e. without the substrate having to be moved, it is of course also possible for the substrate to be moved by a transport device. The advantage of a larger coating zone can be exploited in this case, too.

The coating zone itself is generally planar, although it may also be curved. In the latter case, it is merely necessary to appropriately adjust the position of the cathode assemblies, so that the relation between the position of the coating zone and the location of the cathodes is maintained.

The rotatable magnetrons with cylinder-tube targets are preferably supported at one end, at an end face, in particular on a movable carriage to facilitate inserting them into and removing them from the coating chamber.

Further advantages, characteristics and features of this invention become clear from the following description of a preferred embodiment. The figures are purely schematic.

FIG. 1 shows, in a purely schematic cut view, the arrangement of substrate, i.e. coating zone 1, and a plurality of cathodes 2.

Figure 1:
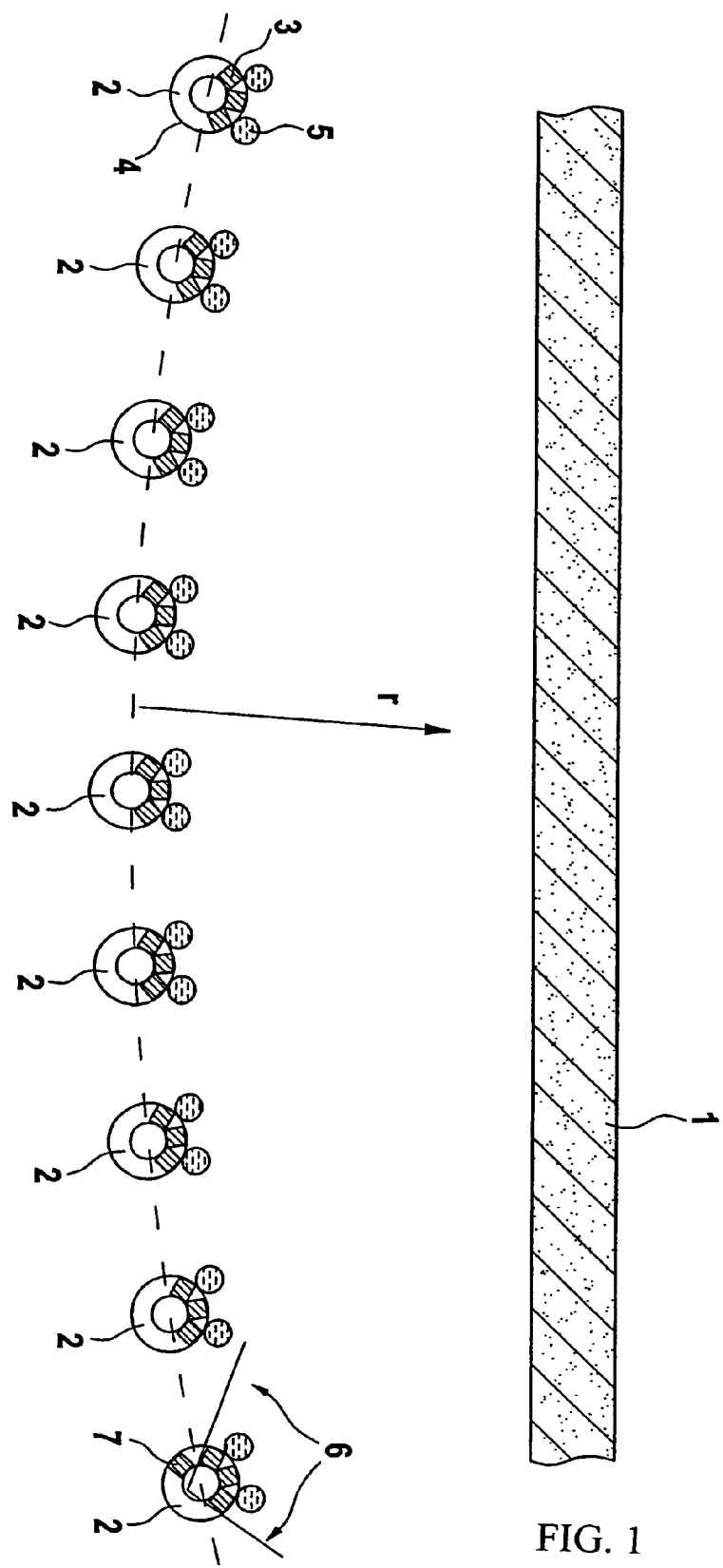
FIG. 1 shows a cut view of the arrangement of cathodes and substrate in a coating chamber.

The cathodes 2 are so-called rotatable magnetron cathodes, a cylindrical target 4 being rotatable about the cathode's longitudinal axis. The magnets 3 of the magnet assembly generate and stabilize a plasma 5, which forms in the immediate vicinity of the target surface. The continuous and consistent rotation of the target 4 during the coating process results in the coating material being removed, that is, sputtered, evenly over the entire surface of the target.

To achieve optimal coating of the substrate in the coating zone 1, the magnet assemblies are positioned facing towards the substrate and, as shown by the angular range 6, are slewable within a given angular range about the cathode's longitudinal axis, thus ensuring that the sputtering zone of the target surface is aligned optimally towards the substrate.

As an alternative to having the magnet assemblies 3 anchored in a fixed position facing the substrate, it is also possible to move the magnet assemblies 3 to and fro during the coating process in order to improve the evenness of the coating thickness on the substrate.

In order to prevent re-deposition, especially in the distal portions of the magnetron cathodes, that is, on the lateral surfaces in the vicinity of the end faces of the cylinder-tube-like target 4, a second, additional magnet assembly 7 may be provided opposite the magnet assembly 3, so that by generation of a plasma at the distal portions of the cylindrical magnetron cathode re-deposition is prevented.

The rotatable magnetrons may be supported in each case, via the end areas, on the ends of the coating chamber. To facilitate exchanging the cathodes, the rotatable magnetrons are preferably mounted on a carriage that can be withdrawn from the coating chamber, the rotatable magnetrons being supported at one end, in the end-face area of the target tube, on one chamber wall by means of a support element that engages concentrically in said target tube. It is to advantage that cantilevered magnetrons of this kind need not be supported additionally on the opposite chamber wall, although this option is also feasible.

As is likewise evident from FIG. 1, the cathodes 2 are not located in a single plane, but are spaced at different distances from the coating zone 1, that is, from the substrate. In the embodiment shown in FIG. 1, the rotatable magnetron cathodes 2 are located, in particular, on a circular path with a radius r that is very much greater than the distance between the rotatable magnetron cathodes and the substrate. This is indicated by the arrow and r. The resulting spatial arrangement is such that the cylinder-tube-like targets 4, i.e., the rotatable magnetron cathodes, which run at right angles to the plane of the drawing, are located on the lateral surface of a cylinder with the radius r, whereas the substrate, i.e. the coating zone 1, is flat and planar. The effect of this spatial arrangement is that large-area substrates, e.g. substrates measuring 1500×1800 mm, can be coated evenly without the substrate having to be moved (static coating). Also with moving substrates, as in the case of continuous-duty in-line coaters, this means that a large coating zone may be provided with a coating of even thickness.

The spatial arrangement of the cathodes relative to the coating zone 1 also ensures a high collection efficiency; as a result, the amount of material that needs to be sputtered is reduced and the number of cathode assemblies may be minimized.

Figure 2:
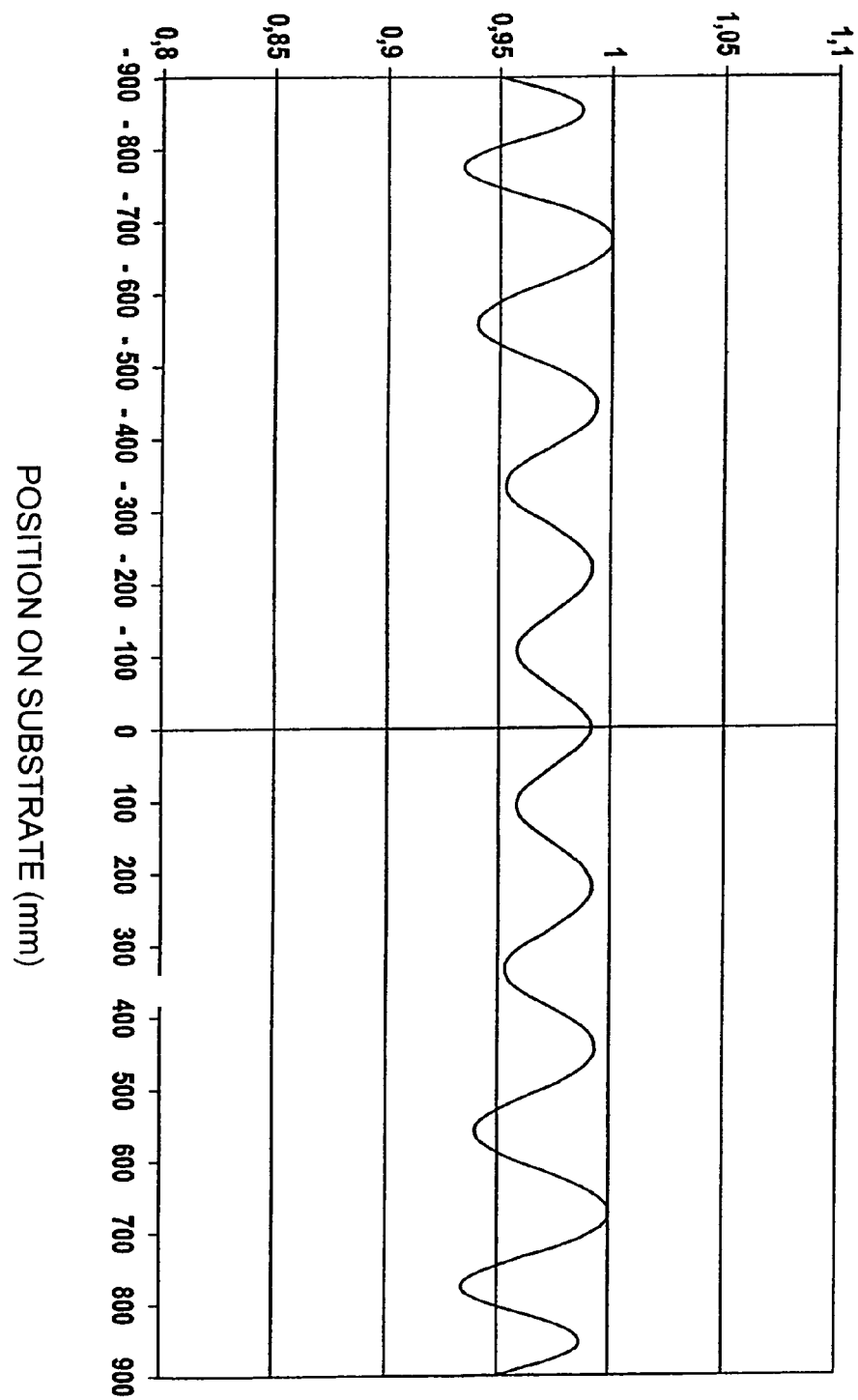
FIG. 2 is a graph showing the normalized coating thickness plotted as a function of the substrate length.

FIG. 2 shows a plot of coating thickness distribution against substrate length for a substrate length of 1800 mm and a cathode assembly according to FIG. 1 with nine rotatable magnetron cathodes. In the graph shown in FIG. 2, the coating thickness, normalized to 1, has been plotted against the length of the substrate. It can be seen that from the outermost edges to the middle, the normalized coating thickness varies essentially within a range from 0.95 to 1.

The invention claimed is:

1. A coater for coating large-area substrates by means of cathode sputtering, said coater comprising a coating chamber and, provided therein, more than three cathode assemblies (2) where a material to be sputtered is located on a target (4) that rotates during a coating process and has a curved surface, wherein the cathode assemblies (2) with rotatable, curved targets (4) are magnetrons with magnets (3) or magnet assemblies provided inside the target (4) and the target (4) rotates around the magnets (3) or magnet assemblies and means are provided for continuously rotating the targets around the magnets or magnet assemblies during the coating process, wherein the more than three cathode assemblies (2) with rotatable, curved targets (4) are positioned one beside the other with two outer cathode assemblies in a single coating chamber for a coherent coating zone at the substrate, wherein the cathode assemblies are positioned equidistant to each other with only the two outer cathode assemblies pushed nearer to adjacent cathode assemblies, providing even coating of static large-area substrates.

2. The coater of claim 1, wherein the cathode assemblies with rotatable, curved targets (4) are supported at one end in the region of an end face.

3. The coater of claim 1 or claim 2, wherein the magnets (3) or magnet assemblies are rotatable or slewable.

4. The coater of claim 3, wherein the magnets (3) or magnet assemblies are adapted to oscillate about a position.

5. The coater of claim 1 or 2, wherein the magnets (3) of the magnet assemblies in the outer cathode assemblies are slewed or displaced in order to enlarge a magnetic field area (6).

6. The coater according to claim 1 or 2, wherein longitudinal axes of the cathode assemblies are parallel to each other.

7. The coater according to claim 3, wherein the magnets or magnet assemblies of the cathode assemblies are oriented radially towards the coating zone, the magnets or magnet assemblies being slewable about a position at defined speeds.

8. The coater according to one of claim 1 or 2, wherein additional magnets or magnet assemblies are provided on a side facing away from the coating zone whereby additional magnets or magnet assemblies prevent re-deposition by generating a plasma during the coating process.

9. The coater according to claim 1, wherein the coating zone is planar.

10. The coater according to claim 1, wherein the target is cylindrical and the material to be sputtered is located on a lateral surface of the target.

11. The coater according to claim 3, wherein said magnets or magnet assemblies are slewable or rotatable about a longitudinal axis of the cathode assemblies.

12. The coater according to claim 8, wherein said additional magnets or magnet assemblies are provided in a vicinity of an end faces of the cathode assemblies.

13. A method for coating static large-area substrates by means of cathode sputtering, said coater comprising a coating chamber and, provided therein, more than three cathode assemblies (2) where a single material to be sputtered is located on a target (4) that rotates during a coating process and has a curved surface, wherein the cathode assemblies (2) with rotatable, curved targets (4) are magnetrons with magnets (3) or magnet assemblies provided inside the target (4) and the target (4) rotates around the magnets (3) or magnet assemblies and means are provided for continuously rotating the targets around the magnets or magnet assemblies during the coating process, wherein during the coating process the more than three cathode assemblies (2) with rotatable, curved targets (4) are positioned one beside the other with two outer cathode assemblies in a single coating chamber for a coherent coating zone at the substrate, wherein the cathode assemblies are positioned equidistant to each other with only the two outer cathode assemblies pushed nearer to adjacent cathode assemblies, providing even coating of static large-area substrates.

14. The method according to claim 13, wherein the magnets (3) or magnet assemblies are rotated or slewed during coating.

15. The method according to claim 14, wherein the magnets (3) or magnet assemblies are oscillated about a position during coating.

* * * * *

UNITED STATES PATENT AND TRADEMARK OFFICE
CERTIFICATE OF CORRECTION

| | | |
|---|---|---|
| PATENT NO. | : 8,137,510 B2 | Page 1 of 1 |
| APPLICATION NO. | : 11/121563 | |
| DATED | : March 20, 2012 | |
| INVENTOR(S) | : Bangert et al. | |

It is certified that error appears in the above-identified patent and that said Letters Patent is hereby corrected as shown below:

In the Claims:

Column 5, Claim 6, Line 13, please delete "claim" and insert -- claims -- therefor;

Column 5, Claim 8, Line 19, please delete "claim" and insert -- claims -- therefor.

Signed and Sealed this
Tenth Day of July, 2012

David J. Kappos
*Director of the United States Patent and Trademark Office*